(12) United States Patent
Yang et al.

(10) Patent No.: US 11,567,550 B2
(45) Date of Patent: Jan. 31, 2023

(54) AUTOMATIC TRANSFER SWITCH (ATS) MODULE FOR AN ELECTRONIC RACK

(71) Applicant: Baidu USA LLC, Sunnyvale, CA (US)

(72) Inventors: Huawei Yang, San Jose, CA (US); Tianyi Gao, San Jose, CA (US); Shuai Shao, Milpitas, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 351 days.

(21) Appl. No.: 16/788,758

(22) Filed: Feb. 12, 2020

(65) Prior Publication Data

US 2021/0247826 A1 Aug. 12, 2021

(51) Int. Cl.
*G06F 1/26* (2006.01)
*H02J 9/06* (2006.01)
*H05K 7/14* (2006.01)

(52) U.S. Cl.
CPC .............. *G06F 1/263* (2013.01); *H02J 9/06* (2013.01); *H05K 7/1492* (2013.01)

(58) Field of Classification Search
CPC ........... G06F 1/263; H02J 9/06; H05K 7/1492
See application file for complete search history.

(56) References Cited

U.S. PATENT DOCUMENTS

| | | | | |
|---|---|---|---|---|
| 10,348,124 | B1* | 7/2019 | MacGregor | G06F 1/263 |
| 2007/0114958 | A1* | 5/2007 | Serrano | H02J 3/007 |
| | | | | 318/267 |
| 2013/0234779 | A1* | 9/2013 | Klug, Jr. | H03K 17/78 |
| | | | | 327/432 |
| 2016/0379768 | A1* | 12/2016 | Pham | H01H 9/20 |
| | | | | 307/142 |
| 2020/0393879 | A1* | 12/2020 | Tsai | G06F 1/189 |

* cited by examiner

*Primary Examiner* — Phil K Nguyen
*Assistant Examiner* — Gayathri Sampath
(74) *Attorney, Agent, or Firm* — Womble Bond Dickinson (US) LLP

(57) ABSTRACT

According to one embodiment, an automatic transfer switch (ATS) module for an electronic rack includes a container and four pairs of relays that are disposed within the container, each pair having a first relay connected in series with a second relay. A first two pairs of relays are arranged to connect to a first power source and are arranged to connect to a power supply unit, and a second two pairs of relays are arranged to connect to a second power source and are arranged to connect to the power supply unit. The four pairs of relays are arranged in one of several open-closed configurations, such that in a first open-closed configuration the first source connects to the power supply unit through a first two pairs of relays and in a second open-closed configuration the second source connects to the power supply unit through a second two pairs of relays.

18 Claims, 8 Drawing Sheets

AUTOMATIC TRANSFER SWITCH (ATS) MODULE FOR AN ELECTRONIC RACK

FIELD

Embodiments of the present disclosure relate generally to an automatic transfer switch (ATS) for electronic racks.

BACKGROUND

Large clusters of computer servers can be kept in dedicated facilities, often in a rack enclosure. The servers can be used in support of the data center industry. Power supply units (PSUs) are used to power the servers in order to enable the server' functionalities, and are therefore an essential element of the rack enclosure. Specifically, PSUs convert power (e.g., alternating current (AC) power) that is drawn from a utility, such as mains AC, to regulated direct current (DC) power that is provided to the servers. As such, the PSU's resiliency is high priority, especially in critical facilities that may be running servers twenty-four hours a day, seven days a week, such as hospitals and data centers.

A common practice to increase resiliency is to have one or more primary PSUs and at least one extra PSU installed in the electronic rack as a backup unit, which may be connected to the same power source as a primary PSU (e.g., the mains AC) or a different power source (e.g., an Uninterruptible Power Supply (UPS) system). If the primary PSU fails (e.g., malfunctions), the extra PSU will begin providing power to the rack. Installing extra PSUs within each electronic rack, however, may cost a considerable amount of money.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
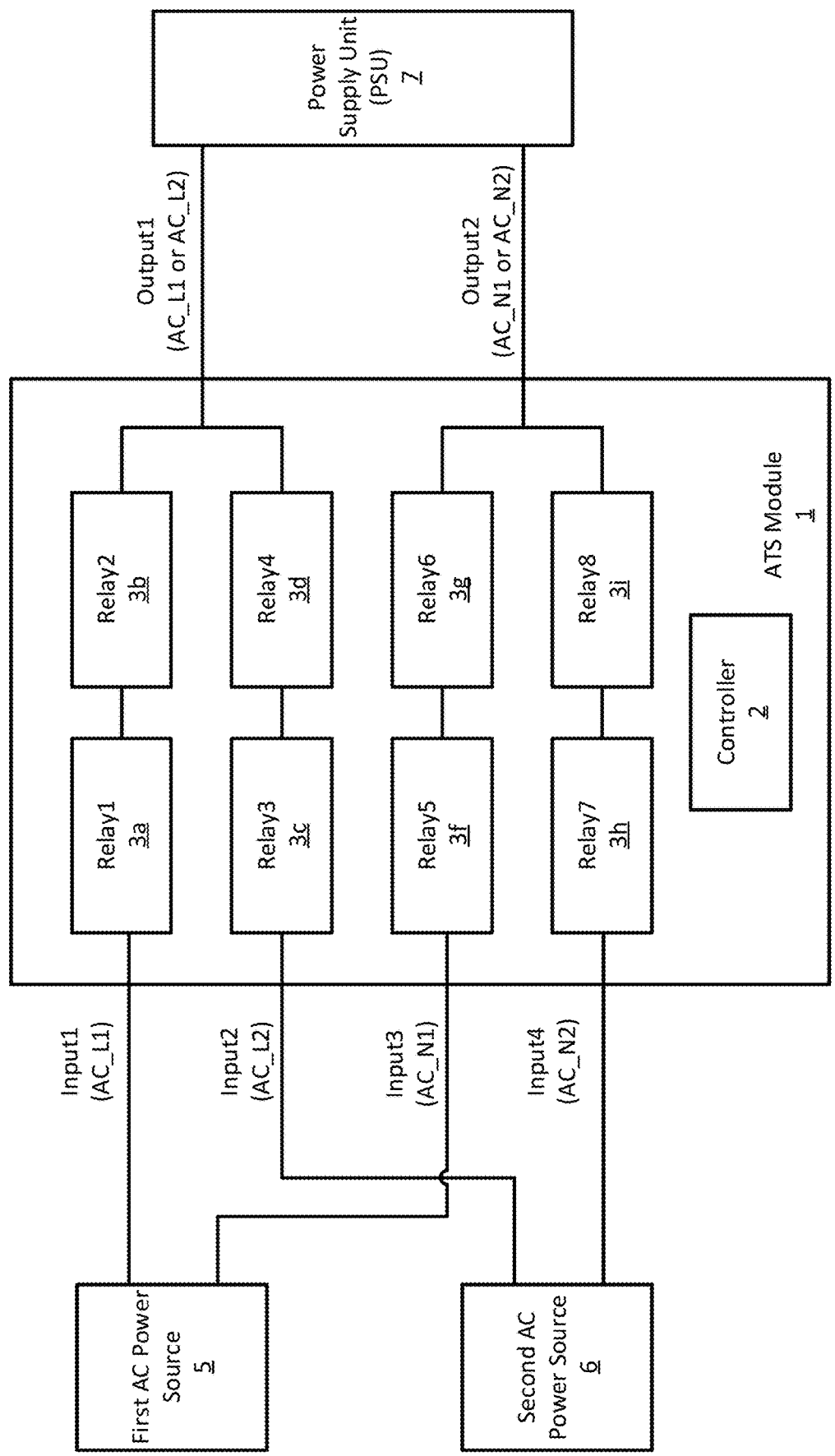
FIG. 1 is a block diagram illustrating an example of an automatic transfer switch (ATS) module for an electronic rack according to one embodiment.

Several embodiments of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

As used herein, a relay is configured to be "open" (or OFF) when there is no continuity between an input and an output (e.g., an input contact and an output contact) of the relay, which does not allow electric current to flow through the relay. In contrast, a relay is configured to be "closed" (or ON) when there is continuity between the two contacts of the relay, which allows the electric current to flow through the relay. In one embodiment, the relay described herein may have one or more inputs and have one or more outputs.

The present disclose solves the problem of increasing resiliency of power supply units (PSUs) for electronic racks that are employed in a critical data processing facilities (e.g., a data center or hospital). The solution proposed in the current disclosure provides an automatic transfer switch (ATS) module to accommodate various PSUs, such as signal input PSUs or double input PSUs (e.g., PSUs that include an ATS mechanism integrated therein). Specifically, the present disclosure describes an ATS module that is coupled between two separate power sources (e.g., an alternating current (AC) power source and a direct current (DC) power source) and a PSU. The ATS module includes several relays, which are configured to connect one of the power sources to the PSU. If failure occurs (e.g., a power outage), the relays may be configured to connect the other power source to the PSU automatically (e.g., without user intervention). The installation of the ATS module enables any regular power supply with standard form factor to fit into an electronic rack's power shelf and be coupled to the ATS in order to have the ability to switch between different sources. The ATS module eliminates the need for N+N PSU redundancy by automatically switching to another active input if one input goes down. As a result, resiliency of the PSU will increase without extra cost. Thus, the present disclosure may lower the Total Cost of Ownership (TCO) for rack mounted power supplies in the critical data processing facilities.

According to one embodiment, an ATS module for an electronic rack includes a container and four pairs of relays that are disposed within the container, each pair having a first relay connected in series with a second relay. A first two pairs of relays are arranged to connect to a first power source and are arranged to connect to a power supply unit, and a second two pairs of relays are arranged to connect to a second power source and are arranged to connect to the power supply unit. The four pairs of relays are arranged in one of several open-closed configurations, such that in a first open-closed configuration the first power source connects to the power supply unit through the first two pairs of relays and in a second open-closed configuration the second power source connects to the power supply unit through the second two pairs of relays.

In one embodiment, the ATS further includes, for each of the relays, a control circuit that configures the relay to close responsive to a control voltage and configures the relay to open in the absence of the control voltage. In another embodiment, the control circuit of at least one relay includes an AC-to-DC converter, where when the control voltage of the at least one relay is an AC control voltage, the AC-to-DC converter converts the AC control voltage into a DC control voltage to configure the relay to open.

In one embodiment, each of the relays is an AC-type electro-mechanical relay. In another embodiment, the first two pairs of relays are AC-type electro-mechanical relays and the second two pairs of relays are DC solid state relays (SSRs). In some embodiments, at least both first relays of the second two pairs of relays are DC SSRs that have a control circuit coupled to an opto-isolator that electrically isolates the power supply unit from the control circuit when the four pairs of relays are arranged in the second open-closed configuration. The opto-isolator has a light emitting diode (LED) and a photodiode, where the control circuit configures the relay to close by causing the LED to optically couple to the photodiode responsive to a control voltage. In some embodiments, both of the second relays of the second two pairs of relays are DC SSRs that each have a fuse connected to a metal-oxide-semiconductor field-effect transistor (MOSFET). The MOSFET configures the second relay to close responsive to an applied control voltage, thereby connecting the second power source to the power supply unit through the fuse. In another embodiment, all of the relays of the second two pairs of relays are DC SSRs that have a control circuit coupled to an opto-isolator.

In one embodiment, the ATS module further includes a connector that is disposed on the container and is arranged to connect an input of each of the first relays of the first two pairs of relays to the first power source and an input of each of the first relays of the second two pairs of relays to the second power source. In some embodiments, the container is sized to fit within one slot of the electronic rack.

According to one embodiment, an electronic rack includes several pieces of Information Technology (IT) equipment, at least one of the pieces of IT equipment including one or more servers to provide data processing services, a power supply unit coupled to the pieces of IT equipment, and an ATS module. The ATS module includes a container and four pairs of relays that are disposed within the container, as previously described.

FIG. 1 is a block diagram illustrating an example of an ATS module for an electronic rack according to one embodiment. This figure shows an ATS module 1 that can be configured to switch between two AC power sources. Specifically, this figure illustrates the ATS module 1, a first AC power source 5, a second AC power source 6, and a power supply unit (PSU) 7. In one embodiment, the PSU is an "external" PSU, such that it is separate from the ATS module, and therefore the ATS module is not integrated within the PSU. In another embodiment, the ATS module 1 is an "AC-AC" ATS module that is designed to be coupled to the two AC power sources in order to provide AC power from (at least) one of the AC power sources to the PSU 7. Thus, as described herein, the components of the ATS module 1 are designed (or constructed) to allow (or prevent) AC current to flow from an AC power source to the PSU.

The ATS module 1 includes four inputs, Input1-Input4, which are coupled to (e.g., terminals) of the first AC power source 5 and the second AC power source 6. In particular, Input1 is coupled to a line terminal of power source 5 (e.g., AC_L1), Input2 is coupled to a line terminal of the power source 6 (e.g., AC_L2), Input3 is coupled to a neutral terminal of the power source 5 (e.g., AC_N1), and Input4 is coupled to a neutral terminal of the power source 6 (e.g., AC_N2). In one embodiment, the AC power sources may be any type of power source that is designed to provide AC power, such as the mains AC or a generator. In another embodiment, at least one of the AC power sources may include a DC power source (e.g., a backup battery) coupled to a power inverter that is designed to convert DC power into AC power. In some embodiments, the ATS module may be coupled to more or less power sources. For example, the ATS module may be coupled to three power sources via six inputs. The ATS module 1 also includes two outputs, Output1 and Output2, which are coupled to (e.g., terminals) of the PSU 7. As described herein, the ATS module may be configured to couple either 1) Input1 to Output1 and Input3 to Output2 in order to provide AC power from source 5 to the PSU or 2) Input2 to Output1 and Input4 to Output2 in order to provide AC power from source 6 to the PSU. More about the inputs and outputs are described herein.

In order to switch between the two power sources, the ATS module 1 includes eight relays 3a-3i, and a controller 2. In one embodiment, the ATS module may include more or less components. For instance, the ATS module may include two or more controllers, or may include less relays. As an example, the ATS module may not include one or more of the even-numbered relays (e.g., Relay2, Relay4, Relay6, and/or Relay8), since these relays may act as redundant relays for the odd-numbered relays, as described herein.

As illustrated, the ATS module 1 includes four pairs of relays, each pair of relays having a first relay connected in series with a second relay. For example, the first pair of relays includes Relay1 3a and Relay2 3b, the second pair of relays includes Relay3 3c and Relay4 3d, the third pair of relays includes Relay5 3f and Relay6 3g, and the fourth pair of relays includes Relay7 3h and Relay 8 3i. In one embodiment, the odd-numbered relays may be considered the "first relay", and the even-numbered relays may be considered the "second relay" in each paired series. In one embodiment, the first relay in each pair has an input (e.g., input contact) that couples to one of the AC power sources (e.g., via an input of the ATS module) and has an output (e.g., output contact) that couples to an input of the second relay in the pair. In addition, the second relay in each pair has an output that couples to the PSU 7 (e.g., via an output of the ATS module).

Of the four pairs, (a first) two pairs are arranged to connect to the first AC power source 5 and are arranged to connect to the PSU, and (a second) two pairs are arranged to connect to the second AC power source 6 and are arranged to connect to the PSU. In one embodiment, the four pairs of relays may be arranged (or configured) in one of several open-closed configurations in which at least some of the relays are open and at least some of the relays are closed in order to provide AC power from one of the sources to the PSU. For example, in a first open-closed configuration, the first power source 5 connects to the PSU 7 through the first two pairs of relays. Specifically, Relay1, Relay2, Relay5, and Relay6 are configured to close, while Relay3, Relay4, Relay7, and Relay8 are configured to open, thus allowing connectivity from the first AC power source to the PSU. As another example, in the second open-closed configuration, the second power source 6 connects to the PSU through the second two pairs of relays. Specifically, Relay1, Relay2, Relay5, and Relay6 are configured to open, while Relay3, Relay4, Relay7, and Relay8 are configured to close, thus allowing connectivity from the second AC power source to the PSU. Thus, in each open-closed configuration only one power source is connected to the PSU through the ATS module.

In one embodiment, different open-closed configurations are possible. For instance, one configuration may be a variation of the first open-closed configuration in which one of the relays in a series-connected pair is configured to open and another is configured to close, which results in the series-connected pair as a whole being open and therefore not having connectivity. As an example, in the first open-closed configuration, Relay3 3c is configured to close, while Relay4 3d is configured to open. As yet another example, another configuration may include neither of the power sources 5 and 6 being connected to the PSU. In particular, at least one of the relays in each pair may be open, thereby not providing power from either power source to the PSU 7.

In one embodiment, the ATS module 1 includes pairs of series-connected relays in order to increase redundancy within the ATS module. Specifically, if one of the relays in the series has a fault, resulting in the relay being shorted, the second relay in the series will ensure the functionality of the ATS module (e.g., by providing the ability to open and close the path created by the series-connected based on the desired open-closed configuration). For example, when a fault occurs in Relay1 3a, this relay may create a short between Input1 and the input of Relay2 3b. The ATS module may continue to function normally by being able to configure Relay2 3b to open or close the path through the series-connected pair between the line terminal of the first AC power source 5 and the PSU 7 based on the desired configuration of the ATS module.

Also illustrated in this figure is the controller 2 that may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the controller may be a circuit with a combination of analog elements (e.g., resistors, capacitors, inductors, etc.) and/or digital elements (e.g., logic-based elements, such as transistors, etc.). The controller may also include memory.

In one embodiment, the controller 2 is configured to obtain (measure or sense) monitoring parameters (or data) associated with the ATS module 1 and perform various operations based on the monitoring parameters. For instance, the controller may measure input voltage (e.g., across Input1 and Input3), input current, output voltage (e.g., across Output1 and Output2), output current, temperature of one or more components within the ATS module, and a relay states of one or more of the relays (e.g., whether a relay is open or closed, or whether the relay is functioning or has a fault). In one embodiment, the controller may monitor other parameters, such as the internal (or surface) temperature of the ATS module. In another embodiment, the ATS module may include one or more sensors that measure one or more of the monitoring parameters and transmit an electronic signal to the controller that represents the monitoring parameter. For example, the ATS module may include a current sensor that includes a shunt resistor. The sensor may measure the voltage across the shunt resistor as an electric signal that represents the current passing through the shunt resistor, and may transmit the signal to the controller.

In another embodiment, the controller may include a temperature sensor (e.g., thermocouple) that measures temperature and produces an electric signal that represents the temperature. For instance, the temperature sensor may measure the temperature of a component, such as a switching element of one or more of the relays, such as a metal-oxide-semiconductor field-effect transistor (MOSFET).

In one embodiment, the controller may be configured to (automatically) control one or more of the relays 3a-3i based on the monitoring data. For example, based on the input voltage across Input1 and Input2 (or an input current through Input1), the controller may determine that there is a power outage in the first AC power source 5 (e.g., based on the input voltage being below a threshold value). In response, the controller may configure the relays 3a-3i in the second open-closed configuration, which connects the second AC power source 6 to the PSU 7. For example, to configure the relays, the controller may apply a control voltage (e.g., AC voltage or DC voltage) across the relay. In one embodiment, to close the relay the controller may apply the control voltage and to open the relay the controller may not provide the control voltage (or apply a different control voltage than applied to open the relay). In another embodiment, in order to maintain the relay in a closed position, the controller may continuously apply the control voltage. As another example, the controller may determine that one of the relays is malfunctioning based on a measured temperature of the relay (or a component within the relay). As a result, the controller may adjust the open-closed configuration of the ATS module to open the malfunctioning relay in order to prevent (or in anticipation of) a fault.

In one embodiment, at least some of the relays may be configured by a controller that is external to the ATS module. For instance, the ATS module may be communicatively coupled one or more controllers (e.g., integrated within the PSU or within the electronic rack in which the ATS module is mounted) via a communication data link (e.g., a wired or wireless link, using any wireless protocol). The ATS module may transmit the monitoring data over the communication data link to the controller. The controller determines the configuration of the relays based on the data, and transmits one or more control signals to the relays (e.g., via the controller 2). In one embodiment, the control signals may be control voltages that are applied across one or more relays of the ATS module, as described herein. More about the communication data link is described herein.

Figure 2:
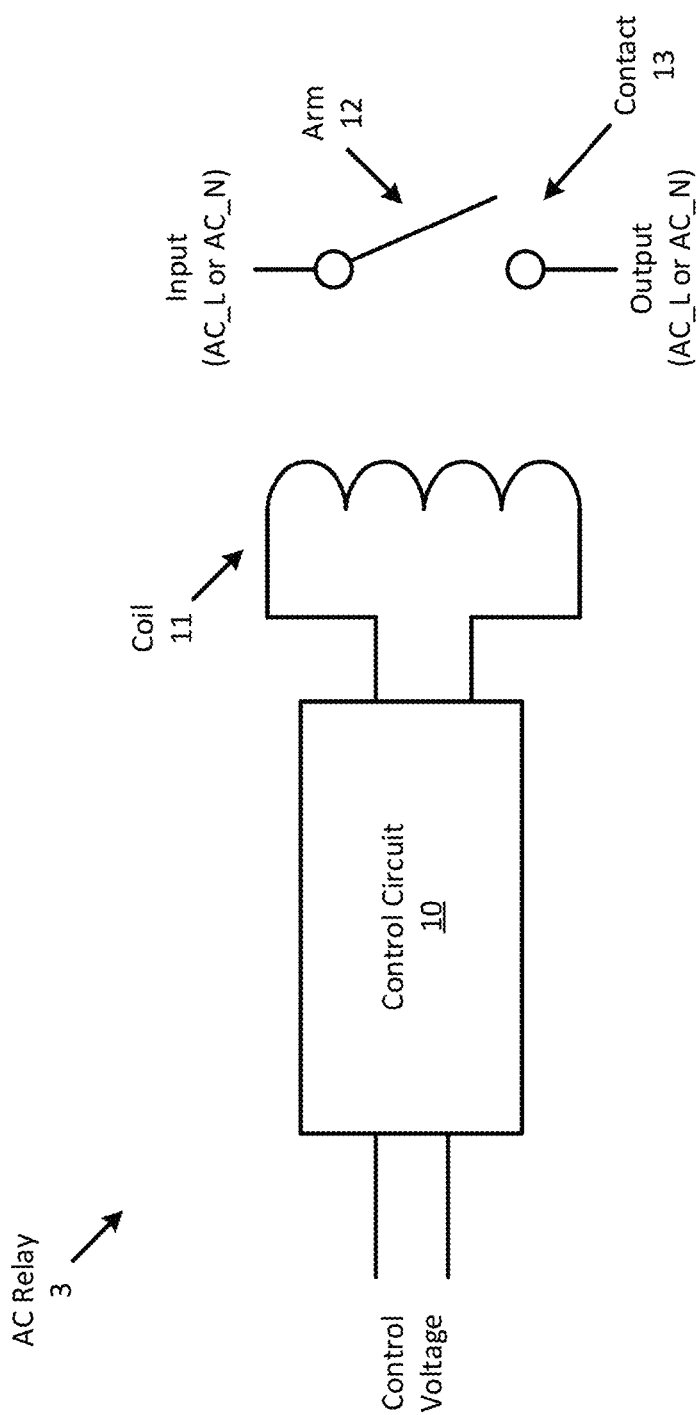
FIG. 2 illustrates an example of an alternating current (AC) relay according to one embodiment.

FIG. 2 illustrates an example of an AC relay according to one embodiment. Specifically, this figure illustrates an AC relay 3, which may be the same as (all or some of the) relays 3a-3i of FIG. 1. In one embodiment, the relay 3 is an "AC" relay because it is designed to pass through AC current. The AC relay is an AC-type electro-mechanical relay that includes a control circuit 10, a (inductive) coil 11, an arm 12 (or armature), and a contact 13. In one embodiment, the arm is coupled to the input of the relay and the contact is coupled to the output of the relay. The arm is adapted to move, as described herein. As illustrated, the arm is not touching (or in contact) with the contact 13, and therefore the relay is in an open state. To close the relay 3, the control voltage is applied to the control circuit 10. In particular, the control circuit configures the relay to close responsive to (an applied) control voltage, and configures the relay to open in the absence of the control voltage. For instance, the control circuit may include a switch (e.g., transistor) that allows current to flow through the coil 11, thereby energizing the coil, responsive to an applied control voltage. The energized coil pulls (via the creation of a magnetic field) the arm 12 to cause the arm to make contact with the contact 13. In one embodiment, the relay is a "normally open" type of relay, which means while the coil is not energized the relay will be open. Thus, so long as the coil is energized, the arm will touch the contact, creating continuity through the relay. Once the coil is "de-energized", meaning that the control voltage is no longer applied, the arm will move away from the contact 13.

In one embodiment, the relay 3 may be configured responsive to a DC control voltage or an AC control voltage. Specifically, the control voltage that is supplied by the controller 2 (or by the PSU, as described herein) may be either AC or DC. In one embodiment, the control circuit 10 may include an AC-to-DC converter in order for the relay to be configured in the presence of an AC control voltage. When the control voltage is an AC control voltage, the converter converts the AC voltage into DC control voltage, which is used by the control circuit to configure the relay (e.g., open the relay). In one embodiment, the control circuit 10 (or at least a portion of the control circuit) may be a part of the controller 2 of the ATS module. For example, the controller 2 may include the AC-to-DC converter, which then transmits a DC control voltage to the control circuit in order to configure the relay 3.

Figure 3:
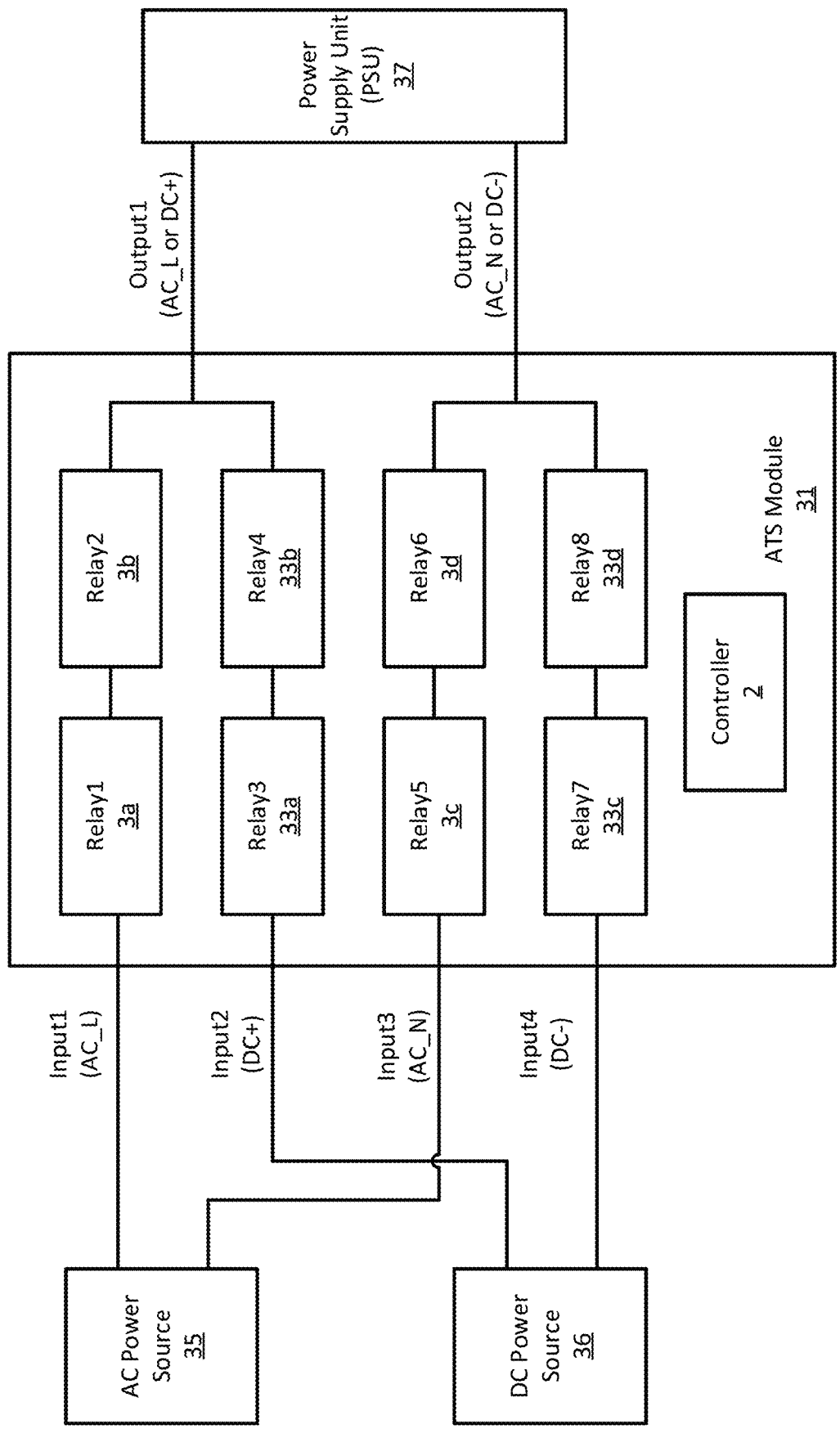
FIG. 3 is a block diagram illustrating another example of an ATS module for an electronic rack according to one embodiment.

FIG. 3 is a block diagram illustrating another example of an ATS module for an electronic rack according to one embodiment. This figure shows an ATS module 31 that can be configured to switch between an AC power source and a DC power source. Specifically, this figure illustrates the ATS module 31, the AC power source 35, a DC power source 36, and a (external) PSU 37. In one embodiment, the ATS module 31 is an "AC-DC" ATS module that is designed to be coupled to an AC power source and a DC power source in order to provide either AC power from the AC power source to the PSU or DC power from the DC power source to the PSU. Thus, as describe herein, at least some of the components of the ATS module 31 are designed to allow (or prevent) AC current to flow from the AC power source to the PSU and at least some of the components of the ATS module 31 are designed to allow (or prevent) DC current to flow from the DC power source to the PSU.

The ATS module 31 includes four inputs, Input1-Input4, which are coupled to the AC power source 35 and the DC power source 36. For instance, Input1 is coupled to a line terminal of the AC power source, Input2 is coupled to a positive (supply) terminal of the DC power source, Input3 is coupled to a neutral terminal of the AC power source, and Input4 is coupled to the negative terminal of the DC power source.

The ATS module 31 includes eight relays 3a-3d and 33a-33d and a controller 2. Similar to ATS module 1 in FIG. 1, ATS module 31 includes four pairs of relays. In contrast to ATS module 1, however, this module includes two pairs of AC relays and two pairs of DC relays. Specifically, module 31 has a first two pairs of relays, Relay1, Relay2, Relay5, and Relay6, which are the AC relays described in FIGS. 1 and 2, that are connected to the AC power source 35 and connected to the PSU 37. The ATS module also includes a second two pairs of relays, Relay3, Relay4, Relay7, and Relay8, which are DC relays that are connected to the DC power source and connected to the PSU 37. As a result, depending on the configuration of the ATS module 31 (e.g., whether the first two pairs of relays or the second two pairs of relays are closed), the outputs of the ATS module will either supply AC power to the PSU or DC power to the PSU.

Figure 4:
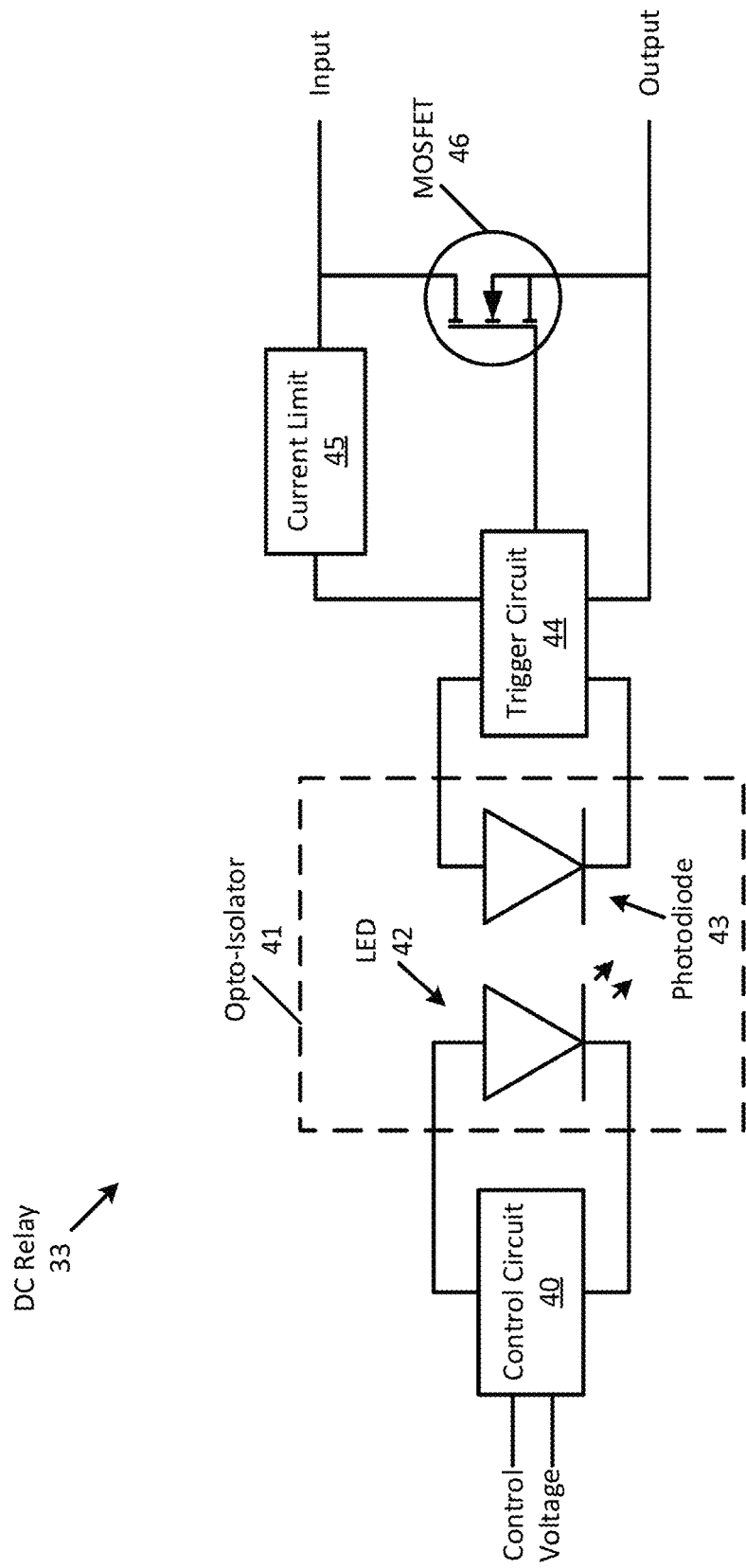
FIG. 4 illustrates an example of a direct current (DC) relay according to one embodiment.

FIG. 4 illustrates an example of a DC relay according to one embodiment. Specifically, this figure illustrates a DC relay 33, which may be the same as (all or some of the) relays 33a-33d of FIG. 3. In one embodiment, the relay 33 is a "DC" relay because it is designed to pass through DC current. The DC relay is a solid state relay (SSR) that includes a control circuit 40, an opto-isolator 41, a trigger circuit 44, a current limit 45, and a metal-oxide-semiconductor field-effect transistor (MOSFET) 46. In one embodiment, the DC relay (or DC SSR) 33 may not include one or more components illustrated herein. For instance, the DC relay 33 may not include an opto-isolator 41 and as a result not provide electrical (DC) isolation between a control input of the DC relay and the (DC power) output.

In one embodiment, the opto-isolator 41 (or optocoupler) is configured to electrically isolate the control circuit 40 from the remainder of the DC relay 33. In particular, during operation in which the MOSFET 46 is on and DC current is flowing from the input of the DC relay (e.g., being provided by the DC power source 36) into the PSU, via the output of the relay, the opto-isolator isolates the control circuit from the PSU. The opto-isolator 41 includes alight emitting diode (LED) 42 that is coupled to the control circuit 40 and a photodiode 43 that is coupled to the trigger circuit 44. When a control voltage (DC or AC) is applied, the control circuit activates the LED 42, which optically couples to (e.g., by emitting light towards) the photodiode, which in response generates current. This current is detected by the trigger circuit 44, which is then energized. When the trigger circuit 44 is energized, it drives the gate of the MOSFET in order to make the MOSFET conductive, thereby allowing DC current to flow through the relay. Once the LED is shut off (e.g., the control voltage is no longer applied to the control circuit), the gate signal applied by the trigger circuit stays low, thereby shutting down the MOSFET.

In one embodiment, the trigger circuit 44 draws (DC) power from the input of the DC relay (e.g., the DC power provided by the DC power source). Thus, if the input is down, then the whole DC relay circuit will not turn on. In another embodiment, since the trigger circuit draws power from the input, it is in series with the current limit 45, which may include one or more resistors, that limits the current drawn by the trigger circuit for circuit protection.

In one embodiment, the MOSFET may be a power (N-channel) MOSFET. In another embodiment, any type of transistor (e.g., a Bipolar Junction Transistor (BJT), etc.) may be used.

In one embodiment, each of the DC relays 33a-33d in FIG. 3 may be the same as the DC relay of FIG. 4. In one embodiment, only one of the relays in each pair of DC relays 33a-33d may be the same as DC relay 33, while the other relay in the pair may be different (e.g., not having electrical isolation). For example, the first relay in a pair of series-connected relays, such as Relay3 33a may have isolation (e.g., an opto-isolator 41), while the second relay, Relay4 33b, may not since only one relay that is isolated may be sufficient for the pair. As a result, the other relay in the series (e.g., Relay4 33b) may be a different type of DC relay, without DC isolation, as illustrated in FIG. 5.

Figure 5:
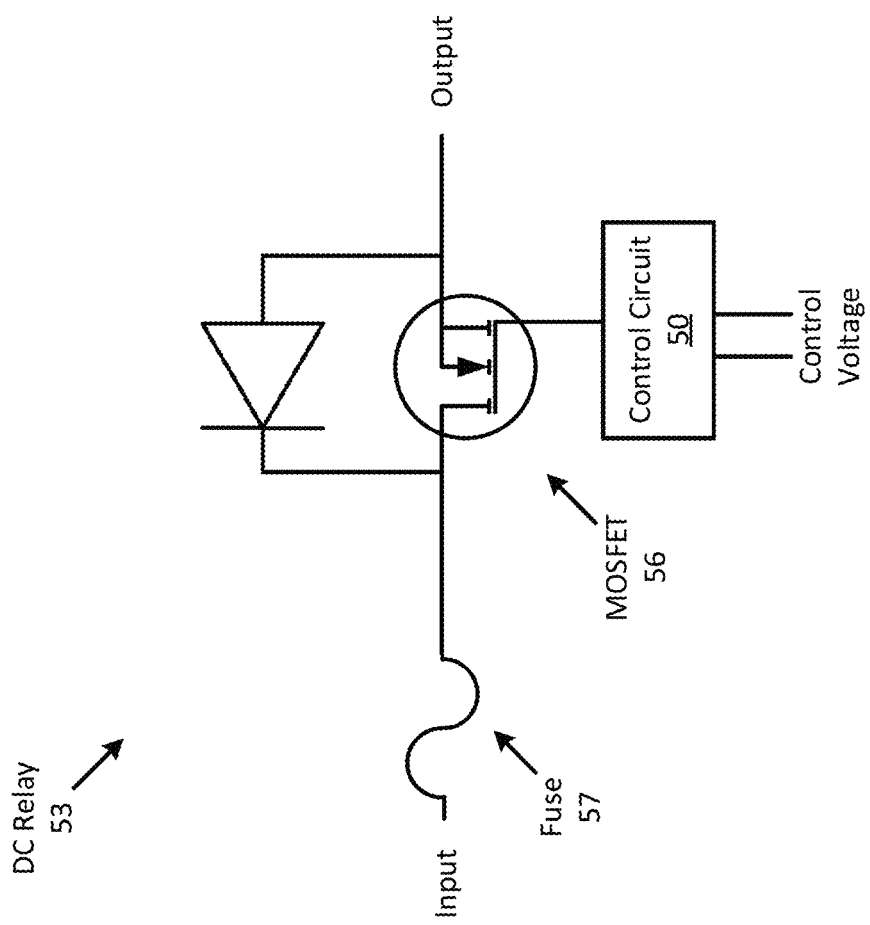
FIG. 5 illustrates another example of a DC relay according to one embodiment.

FIG. 5 illustrates another example of a DC relay according to one embodiment. Specifically, this figure illustrates a DC relay (or DC SSR) 53 that includes a control circuit 50, a MOSFET 56 (with an illustrated body diode), and a fuse 57. As illustrated, the fuse is coupled between the input of the DC relay 53 and the MOSFET. The fuse is designed to provide overcurrent protection to the relay. In one embodiment, the fuse is removeably coupled to the input and MOSFET in order to allow a user to replace the fuse. During operation (e.g., when the control voltage is applied to the control circuit), the control circuit 50 drives the gate of the MOSFET, which configures the relay to close, thereby allowing DC current to flow from the input of the relay (through the fuse) to the output (and therefore connecting the DC power source to the PSU).

As describe herein, at least some of the relays of the ATS module may be the DC relay 53. For example, referring to FIG. 3, Relay4 and Relay8 may be DC relay 53, while Relay3 and Relay 7 are each DC relay 33.

Figure 6:
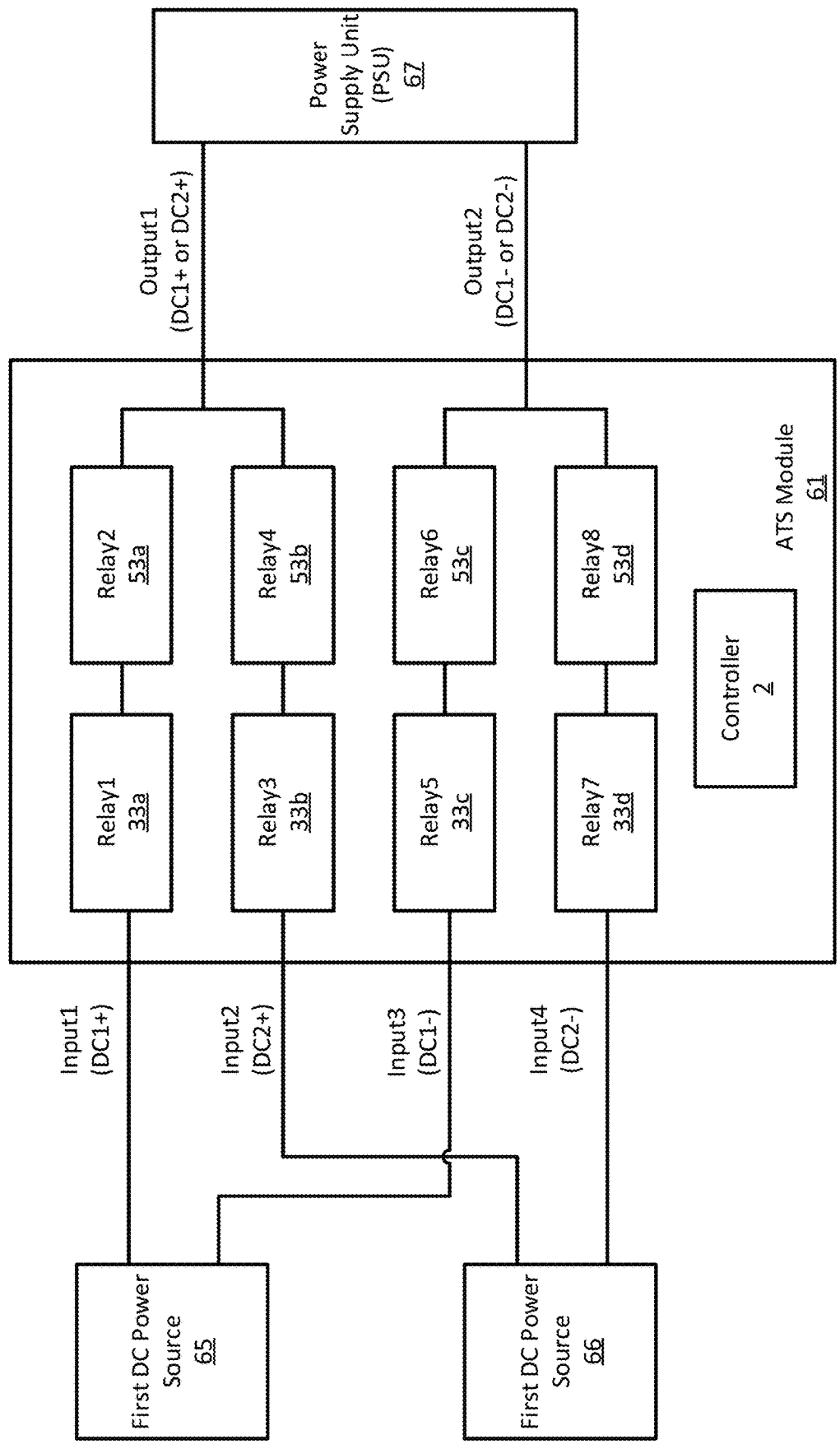
FIG. 6 is a block diagram illustrating another example of an ATS module for an electronic rack according to one embodiment.

FIG. 6 is a block diagram illustrating another example of an ATS module for an electronic rack according to one embodiment. This figure shows an ATS module 61 that can be configured to switch between two DC power sources. Specifically, this figure illustrates ATS module 61, a first DC power source 65, a second DC power source 66, and a (external) PSU 67. In one embodiment, the ATS module 61 is a "DC-DC" ATS module that is designed to be coupled to two DC power sources to provide DC power from one of the sources to the PSU. Thus, as described herein, at least some of the components of the ATS module 61 are designed to allow (or prevent) DC current to flow form the DC power source to the PSU 67. The four inputs of the ATS module 61 are coupled to the two DC power sources, such that Input1 is coupled to a positive terminal of the first source, Input2 is coupled to a positive terminal of the second source, Input3 is coupled to a negative terminal of first source, and Input4 is coupled to a negative terminal of the second source.

The ATS module includes eight relays 33a-33d and 53a-53d and the controller 2. As described herein, the eight relays are arranged in four pairs of relays. Specifically, the first relay of each pair (e.g., Relay1 33a) is the DC relay 33 of FIG. 4, while the second relay of each pair (e.g., Relay2 53a) is the DC relay 53 of FIG. 5. In one embodiment, all eight relays may be the same as the DC relay 33 or they may all be the same as DC relay 53.

As described thus far, at least three different ATS modules may be designed: an AC-AC ATS module (e.g., module 1), an AC-DC ATS module (e.g., module 31), and a DC-DC ATS module (e.g., module 61). In one embodiment, the relays are designed to be removed from ATS module in order to configure the ATS module into one of the at least three designed described herein. For example, relays 3c, 3d, 3h, and 3i in module 1 of FIG. 1 may be removeably coupled to the (e.g., input and output of the) ATS module. These relays may be replaced by DC relay 33 in order to make an AC-DC ATS module, as illustrated in FIG. 3.

Figure 7:
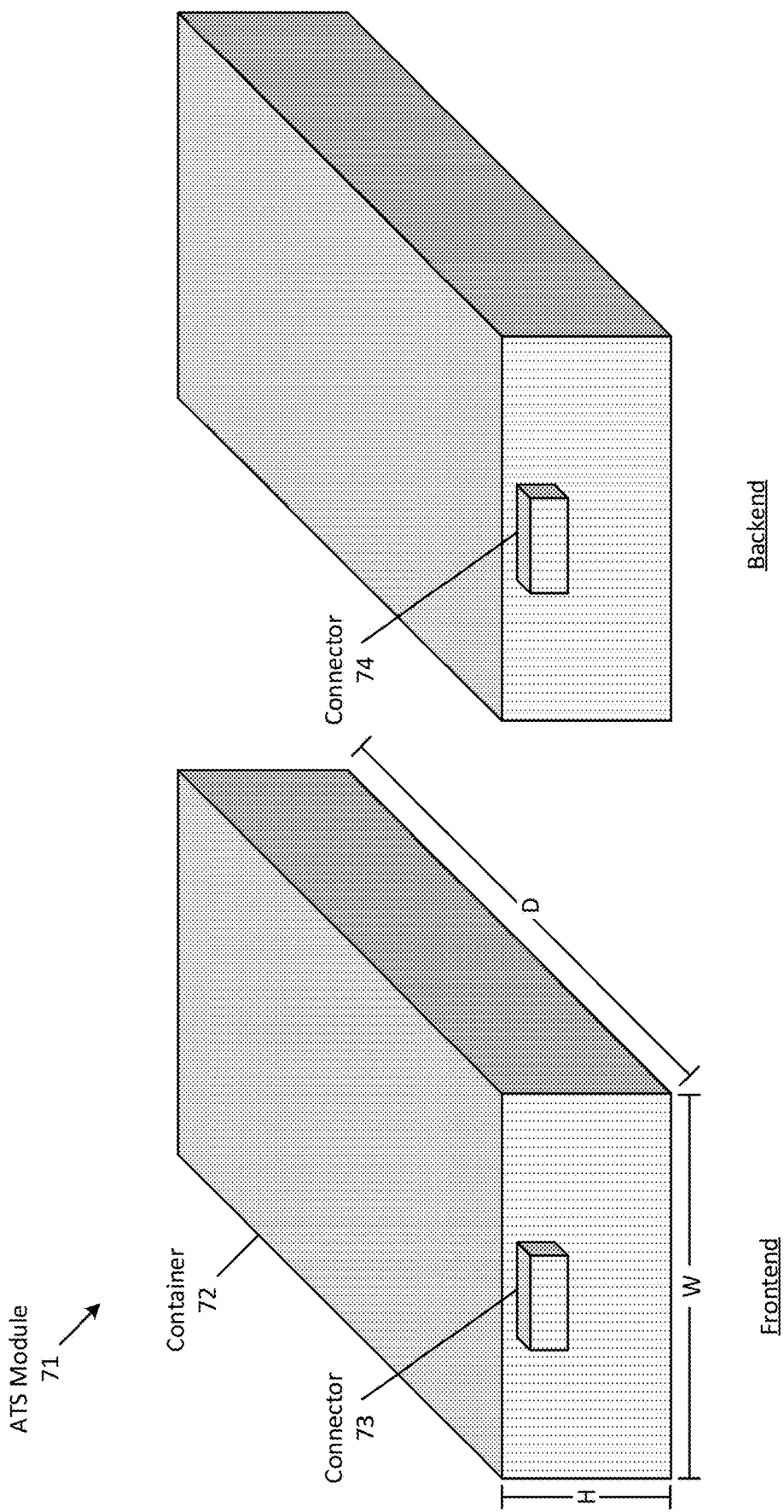
FIG. 7 shows several perspective views of an ATS module according to one embodiment.

FIG. 7 shows several perspective views of an ATS module according to one embodiment. Specifically, this figure illustrates a frontend perspective view and a backend perspective view of an ATS module 71 that includes a container 72, a (frontend) connector 73, and a (backend) connector 74. The container is a rectangular box that has a depth ("D") from about 100 mm to 140 mm, for example from 105 mm to 135 mm or from 110 mm to 130 mm. In one embodiment, D is 120 mm. The container has a width ("W") that is from about 40 mm to 100 mm, for example from 50 mm to 90 mm or from 60 mm to 80 mm. In one embodiment, W is 70 mm. The container has a height ("H") that is from about 20 mm to 60 mm, for example from 25 mm to 55 mm or from 30 mm to 50 mm. In one embodiment, H is 40 mm. In one embodiment, the (container of the) ATS module may be sized to fit within one slot of an electronic rack. In particular, the module may be sized according to one standard rack unit (e.g., 1U). For example, H may be less than 44.45 mm, such as 40 mm as described herein.

In one embodiment, the container 2 may have any shape, such as being cube-shaped or cylindrically-shaped. In one embodiment, the container may be composed of any type of material, such as a metal or an alloy (e.g., steel). In another embodiment, the ATS module 71 may be the same or similar to the previously mentioned ATS modules. For example, the ATS module 71 may be an AC-AC ATS module that is similar to ATS module 1. As a result, each of the relays, 3a-3i and/or the controller 2 may be disposed within the container 2. In one embodiment, the container has an opening (e.g., a lid) that is arranged to allow access to the components disposed therein.

In one embodiment, connector 73 may be a power connector that is arranged to removeably couple to (one or more connectors of) one or more AC or DC power sources. Table 1 provides the pins of the connector.

TABLE 1

| Connector 73 | |
|---|---|
| Pin 1 | Input1 |
| Pin 2 | Input3 |
| Pin 3 | Input2 |
| Pin 4 | Input4 |
| Pin 5 | Earth GND |

Thus, Table 1 illustrates which pins of the connector 73 correspond to the inputs of the ATS module. Thus, one power source may connect to at least a portion of the connector (e.g., Pin 1 and Pin 2), while another power source may connect to at least another portion of the connector (e.g., Pin 2 and Pin 4). In one embodiment, at least one of the sources may also couple to Pin 5, ground.

In another embodiment, connector 74 may be a power and signal connector that is arranged to removeably couple to (one or more connectors of) a PSU, such as PSU 67. Table 2 provides the pins of this connector

TABLE 2

| Connector 74 | |
|---|---|
| Pin 1 | Output1 |
| Pin 2 | Output 2 |
| Pins 3-n | Signal |

Table 2 illustrates that Pin 1 corresponds to Output1 and Pin 2 corresponds to Output2. Table 2 also shows one or more Signal pins of the ATS module that are arranged for transmitting output signals and/or receiving input signals. Thus, connector 74 is arranged to couple to the PSU in order to provide output power to the PSU (based on the configuration of the relays of the ATS module), and provide signaling between the ATS module and the PSU. Specifically, at least some of the pins are for transmitting output signals, such as monitoring data (e.g., input voltage, etc.) as described herein to the PSU. As another example, at least some of the pins are for receiving input signals (data), such as control signals (e.g., control voltages, etc.).

In one embodiment, at least some of Pins 3-n may couple to the PSU in order to communicatively couple the PSU to the ATS module based on a communication protocol over which the PSU communicates with the ATS module. For example, the ATS module may communicatively couple using at least one communication protocol, such as a Controller Area Network (CAN) bus or a Power Management (PM) bus. In one embodiment, the ATS module may communicate using any communication protocol. In another embodiment, the PSU may couple via a first set of pins when communicating over a first protocol (e.g., CAN bus), and may couple via a second set of pins when communicating over a second protocol (e.g., PM bus).

In one embodiment, one or more electronic devices may couple to the connector 74. For example, the PSU may couple to the Output1 and Output2, while another electronic device (e.g., a RMC, as described in FIG. 8) may couple to the Signal pins in order to control the operations of the ATS module (e.g., the relay configuration, etc.).

In some embodiments, the ATS module 71 may include one or more mechanical clips (not illustrated) for mounting the ATS module on a PSU. For example, the container 72 may have a mechanical clip disposed on (a side of) the container 72 and arranged to attach to (a mating clip of) on a side of the PSU. Thus, the ATS module may be removeably coupled to a PSU that is mounted within an electronic rack.

In one embodiment, the ATS module 71 may be designed for a range of power specifications. Table 3 provides power specifications of the ATS module.

TABLE 3

Power Specifications

| Input AC Voltage | 180 V~305 V |
|---|---|
| Input DC Voltage | 190 V~300 V |
| Rated Current | 20 A |
| Max Temperature | 140 C. |

In one embodiment, the power specifications may be different. For example, the rated current may be from about 10 A to 30 A, for example from 15 A to 25 A. In one embodiment, the rated current is 20 A. As another example, the maximum temperature may be from about 120 C to 160 C, for example from 130 C to 150 C. In one embodiment, the maximum temperature is 140 C.

Figure 8:
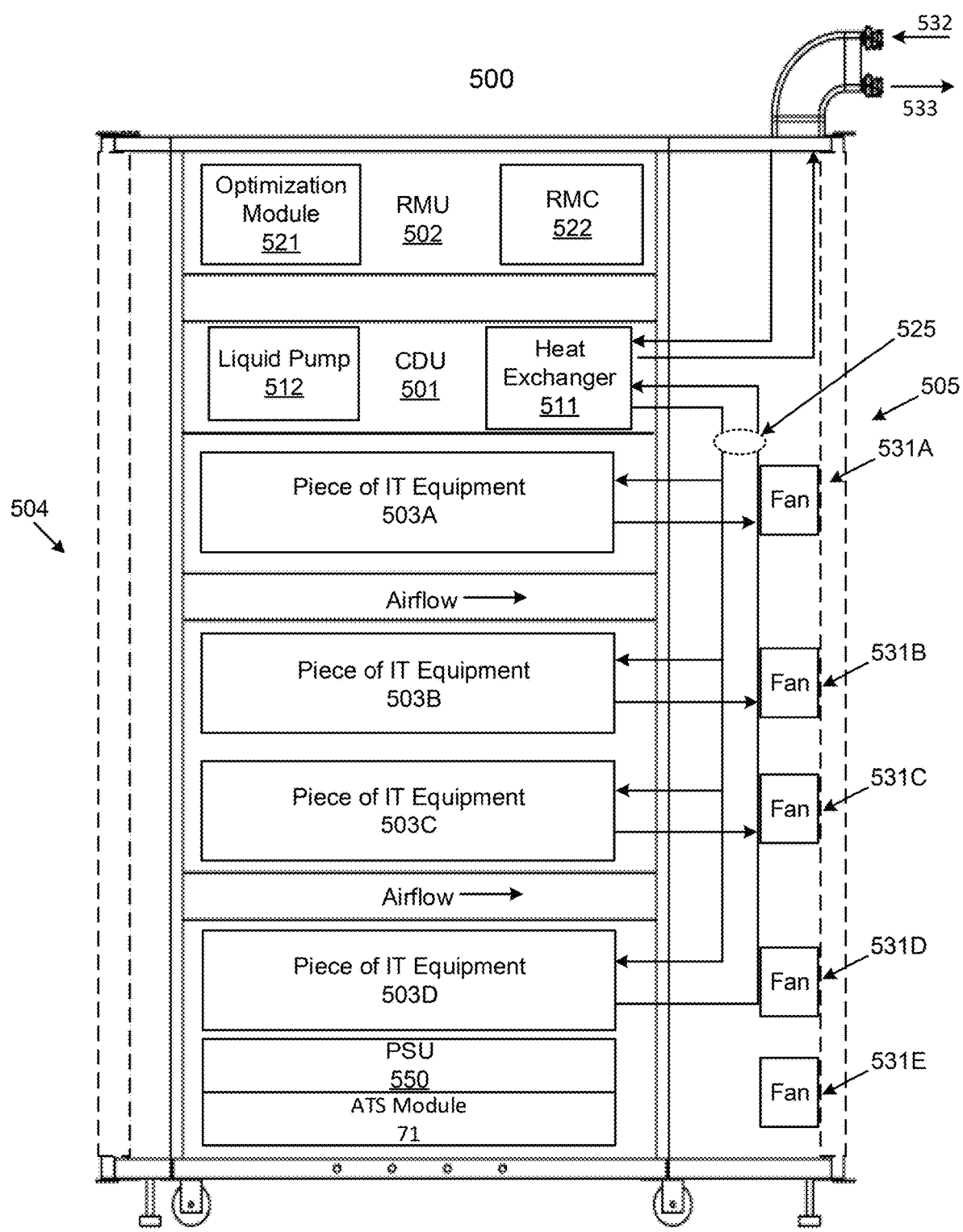
FIG. 8 is an example of an electronic rack with an ATS module according to one embodiment.

FIG. 8 is an example of an electronic rack with an ATS module 71 according to one embodiment. Electronic rack 500 may include one or more server slots to contain one or more servers respectively. Each server includes one or more information technology (IT) components (e.g., processors, memory, storage devices, network interfaces). According to one embodiment, electronic rack 500 includes, but is not limited to, CDU 501, rack management unit (RMU) 502 (optional), a power supply unit (PSU) 550, the ATS module 71, and one or more pieces of IT equipment (or IT equipment) 503A-503D, which may be any type of IT equipment, such as server blades. The IT equipment 503 can be inserted into an array of server slots respectively from frontend 504 or backend 505 of electronic rack 500. In one embodiment, one or more ATS modules (e.g., module 1, module 31, module 61, etc.) may be inserted into any of server slots within the electronic rack 500. For instance, the electronic rack 500 may include at least one ATS module for each PSU 550 that is mounted within the rack. Thus, the ATS module 71 is paired with the PSU 550. In some embodiments, the PSU 550 and/or ATS module 71 may be inserted into any of server slots within the electronic rack 500. As illustrated, the ATS module 71 is inserted into the most bottom server slot (below the PSU 550).

Note that although there are only four pieces of IT equipment 503A-503D shown here, more or fewer pieces of IT equipment may be maintained within electronic rack 500. Also note that the particular positions of CDU 501, RMU 502, PSU 550, ATS module 71, and IT equipment 503 are shown for the purpose of illustration only; other arrangements or configurations of these components. may also be implemented. Note that electronic rack 500 can be either open to the environment or partially contained by a rack container, as long as the cooling fans can generate airflows from the frontend to the backend (or generate airflows from the backend to the frontend).

In addition, a fan module can be associated with each of the pieces of IT equipment 503, and the PSU/ATS module. In this embodiment, fan modules 531A-531E, collectively referred to as fan modules 531, and are associated with the pieces of IT equipment 503A-503D and both the PSU and ATS module, respectively. Each of the fan modules 531 includes one or more cooling fans. Fan modules 531 may be mounted on the backends of IT equipment 503 to generate airflows flowing from frontend 504, traveling through the rack 500, and existing at backend 505 of electronic rack 900. In another embodiment, one or more of the fan modules may be positioned on the frontend 504 of the rack 500. Such frontend fans may be configured to push air into the mounted equipment.

In one embodiment, CDU 501 mainly includes heat exchanger 511, liquid pump 512, and a pump controller (not shown), and some other components such as a liquid reservoir, a power supply, monitoring sensors and so on. Heat exchanger 511 may be a liquid-to-liquid heat exchanger. Heat exchanger 511 includes a first loop with inlet and outlet ports having a first pair of liquid connectors coupled to external liquid supply/return lines 532-533 to form a primary loop. The connectors coupled to the external liquid supply/return lines 532-533 may be disposed or mounted on backend 505 of electronic rack 500. The liquid supply/return lines 532-533 are coupled to a set of room manifolds, which are coupled to an external heat removal system, or extremal cooling loop. In addition, heat exchanger 511 further includes a second loop with two ports having a second pair of liquid connectors coupled to liquid manifold 525 to form a secondary loop, which may include a supply manifold to supply cooling liquid to the pieces of IT equipment 503 and a return manifold to return warmer liquid back to CDU 501. Note that CDUs 501 can be any kind of CDUs commercially available or customized ones. Thus, the details of CDUs 501 will not be described herein.

Each of the pieces of IT equipment 503 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. IT equipment 503 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 500 further includes optional RMU 502 configured to provide and manage power supplied to servers 503, fan modules 531, and CDU 501. Optimization module 521 and RMC 522 can communicate with a controller in some of the applications. RMU 502 may be coupled to PSU 550 to manage the power consumption of the PSU. The PSU 550 may include the necessary circuitry (e.g., an alternating current (AC) to direct current (DC) or DC to DC power converter, backup battery, transformer, or regulator, etc.) to provide power to the rest of the components of electronic rack 500. In addition, the RMU may be coupled to the ATS module 71 to receive monitoring data and transmit control signals for configuring the ATS module based on the monitoring data.

In one embodiment, RMU 502 includes optimization module 521 and rack management controller (RMC) 522. RMC 522 may include a monitor to monitor operating status of various components within electronic rack 500, such as, for example, the pieces of IT equipment 503, CDU 501, and fan modules 531. Specifically, the monitor receives operating data from various sensors representing the operating environments of electronic rack 500. For example, the monitor may receive operating data representing temperatures of the processors, cooling liquid, and airflows, which may be captured and collected via various temperature sensors. The monitor may also receive data representing the fan power and pump power generated by the fan modules 531 and liquid pump 512, which may be proportional to their respective speeds. These operating data are referred to as real-time operating data. Note that the monitor may be implemented as a separate module within RMU 502.

Based on the operating data, optimization module 521 performs an optimization using a predetermined optimization function or optimization model to derive a set of optimal fan speeds for fan modules 531 and an optimal pump speed for liquid pump 512, such that the total power consumption of liquid pump 512 and fan modules 531 reaches minimum, while the operating data associated with liquid pump 512 and cooling fans of fan modules 531 are within their respective designed specifications. Once the optimal pump speed and optimal fan speeds have been determined, RMC 522 configures liquid pump 512 and cooling fans of fan modules 531 based on the optimal pump speed and fan speeds.

As an example, based on the optimal pump speed, RMC 522 communicates with a pump controller of CDU 501 to control the speed of liquid pump 512, which in turn controls a liquid flow rate of cooling liquid supplied to the liquid manifold 525 to be distributed to at least some of server blades 503. Therefore, the operating condition and the corresponding cooling device performance are adjusted. Similarly, based on the optimal fan speeds, RMC 522 communicates with each of the fan modules 531 to control the speed of each cooling fan of the fan modules 531, which in turn control the airflow rates of the fan modules 531. Note that each of fan modules 531 may be individually controlled with its specific optimal fan speed, and different fan modules and/or different cooling fans within the same fan module may have different optimal fan speeds.

In one embodiment, the RMU may monitor and configure the ATS module 71 through the RMC 522. Specifically, the RMC may be communicatively coupled to the ATS module 71 via a communication data link (e.g., a wired link). For example, the RMC may couple to connector 74 (e.g., at least one of the Signal Pins 3-$n$). Once connected, the ATS module may transmit monitoring data over the communication data link using any communication protocol, such as a Controller Area Network (CAN) bus or a Power Management (PM) bus. In one embodiment, the RMC may transmit control signals (e.g., control voltages) to (one or more relays of) the ATS module 71 (e.g., via controller 2) in order to configure the ATS module based on the received monitoring data. In one embodiment, the control signals may be transmitted over the same Signal pins of the connector 74. In another embodiment, control signals may be transmitted via connector 74) to which the RMC is coupled. In one embodiment, another electronic device may perform at least some of these operations. For example, the PSU 550 may be communicatively coupled to the ATS module and may be receive monitoring data and transmit control signals to the ATS module.

Note that some or all of the IT equipment 503 (e.g., 503A, 503B, 503C, and/or 503D) may utilize different cooling methods. For instance, one server may utilize air cooling while another server may utilize liquid cooling. Alternatively, one IT component of a server may utilize air cooling while another IT component of the same server may utilize liquid cooling.

In one embodiment, an embodiment of the disclosure may be (or include) a non-transitory machine-readable medium (such as microelectronic memory) having stored thereon instructions, which program one or more data processing components (generically referred to here as a "processor") to ATS module operations, such as configuring relays to open or close, and monitoring data to determine when to re-configure the ATS module (e.g., based on a power outage). Thus, at least some of these operations may be performed by a controller (e.g., controller 2) integrated within the ATS module, and/or at least some of the operations may be performed by another controller (e.g., within the RMU 502). In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such embodiments are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some embodiments, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some embodiments, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. An automatic transfer switch (ATS) module for an electronic rack, comprising:
a container; and
four pairs of relays that are disposed within the container, each pair having a first relay connected in series with a second relay,
wherein a first two pairs of relays of the four pairs of relays are Alternating Current (AC)-type electro-mechanical relays and a second two pairs of relays of the four pairs of relays are Direct Current (DC) solid state relays (SSRs),
wherein the first two pairs of relays are arranged to connect to an AC power source and are arranged to connect to a power supply unit, and the second two pairs of relays are arranged to connect to a DC power source and are arranged to connect to the power supply unit,
wherein the four pairs of relays are arranged in one of a plurality of open-closed configurations, such that in a first open-closed configuration the first two pairs of relays electrically connect the AC power source to the power supply unit and in a second open-closed configuration the second two pairs of relays electrically connect the DC power source to the power supply unit, and
wherein the first relay of both of the second two pairs of relays are DC SSRs that have a control circuit coupled to an opto-isolator that electrically isolates the power supply unit from the control circuit when the four pairs of relays are arranged in the second open-closed configuration, the opto-isolator having a light emitting diode (LED) and a photodiode, wherein each control circuit configures its respective relay to close by causing the LED to optically couple to the photodiode responsive to a control voltage.

2. The ATS module of claim 1, wherein the control voltage is a first control voltage, wherein each of the control circuits is a first control circuit, wherein each relay of the first two pairs of relays comprises a second control circuit that configures its respective relay to close responsive to a second control voltage and configures its respective relay to open in the absence of the second control voltage.

3. The ATS module of claim 2, wherein at least one second control circuit of the first two pairs of relays comprises an alternating current-to-direct current (AC-to-DC) converter, wherein when the second control voltage of the at least one second control circuit is an AC control voltage the AC-to-DC converter converts the AC control voltage into a DC control voltage to configure its respective relay.

4. The ATS module of claim 1, wherein the second relay of both of the second two pairs of relays are DC SSRs that each have a fuse connected to a metal-oxide-semiconductor field-effect transistor (MOSFET), wherein each MOSFET configures its respective second relay to close responsive to an applied control voltage, thereby connecting the DC power source to the power supply unit through the fuse.

5. The ATS module of claim 1, wherein each second relay of the second two pairs of relays is a DC SSRs that has a respective control circuit coupled to a respective opto-isolator.

6. The ATS module of claim 1, further comprising a connector that is disposed on the container and is arranged to connect an input of each of the first relays of the first two pairs of relays to the AC power source and an input of each of the first relays of the second two pairs of relays to the DC power source.

7. The ATS module of claim 1, wherein the container is sized to fit within one slot of the electronic rack.

8. An electronic rack, comprising:
a plurality of pieces of Information Technology (IT) equipment, at least one of the pieces of IT equipment including one or more servers to provide data processing services;
a power supply unit coupled to the plurality of pieces of IT equipment; and
an automatic transfer switch (ATS) module that includes
a container; and
four pairs of relays that are disposed within the container, each pair having a first relay connected in series with a second relay,
wherein a first two pairs of relays of the four pairs of relays are Alternating Current (AC)-type electro-mechanical relays and a second two pairs of relays of the four pairs of relays are Direct Current (DC) solid state relays (SSRs),
wherein the first two pairs of relays are arranged to connect to a AC power source and are arranged to connect to the power supply unit, and the second two pairs of relays are arranged to connect to a DC power source and are arranged to connect to the power supply unit,
wherein the four pairs of relays are arranged in one of a plurality of open-closed configurations, such that in a first open-closed configuration the first two pairs of relays electrically connect the AC power source to the power supply unit and in a second open-closed configuration the second two pairs of relays electrically connect the DC power source to the power supply unit,
wherein the first relay of both of the second two pairs of relays are DC SSRs that have a control circuit coupled to an opto-isolator that electrically isolates the power supply unit from the control circuit when the four pairs of relays are arranged in the second open-closed configuration, the opto-isolator having a light emitting diode (LED) and a photodiode, wherein each control circuit configures its respective relay to close by causing the LED to optically couple to the photodiode responsive to a control voltage.

9. The electronic rack of claim 8, wherein the control voltage is a first control voltage, wherein each of the control circuits is a first control circuit, wherein each relay of the first two pairs of relays comprises a second control circuit that configures its respective relay to close responsive to a second control voltage and configures its respective relay to open in the absence of the second control voltage.

10. The electronic rack of claim 9, wherein at least one second control circuit of the first two pairs of relays comprises an alternating current-to-direct current (AC-to-DC) converter, wherein when the second control voltage of the at least one second control circuit is an AC control voltage the AC-to-DC converter converts the AC control voltage into a DC control voltage to configure its respective relay.

11. The electronic rack of claim 8, wherein the second relay of both of the second two pairs of relays are DC SSRs that each have a fuse connected to a metal-oxide-semiconductor field-effect transistor (MOSFET), wherein each MOSFET configures its respective second relay to close responsive to an applied control voltage, thereby connecting the DC power source to the power supply unit through the fuse.

12. The electronic rack of claim 8, wherein each second relay of the second two pairs of relays is a DC SSRs that has a respective control circuit coupled to a respective opto-isolator.

13. The electronic rack of claim 8, wherein the ATS module further comprises a connector that is disposed on the container and is arranged to connect to an input of each of the first relays of the first two pairs of relays to the AC power source and an input of each of the first relays of the second two pairs of relays to the DC power source.

14. The electronic rack of claim 8, wherein the container of the ATS module is sized to fit within one slot of the electronic rack.

15. An automatic transfer switch (ATS) module for an electronic rack, comprising:
 a container; and
 four pairs of relays that are disposed within the container, each pair having a first relay connected in series with a second relay,
 wherein each of the relays are Direct Current (DC) solid state relays (SSRs),
 wherein a first two pairs of relays of the four pairs of relays are arranged to connect to a first DC power source and are arranged to connect to a power supply unit, and a second two pairs of relays of the four pairs of relays are arranged to connect to a second DC power source and are arranged to connect to the power supply unit,
 wherein the four pairs of relays are arranged in one of a plurality of configurations, such that in a first configuration the first two pairs of relays electrically connect the first DC power source to the power supply unit and in a second configuration the second two pairs of relays electrically connect the second DC power source to the power supply unit, and
 wherein the first relay of both of the second two pairs of relays are DC SSRs that have a control circuit coupled to an opto-isolator that electrically isolates the power supply unit from the control circuit when the four pairs of relays are arranged in the second open-closed configuration, the opto-isolator having a light emitting diode (LED) and a photodiode, wherein each control circuit configures its respective relay to close by causing the LED to optically couple to the photodiode responsive to a control voltage.

16. The ATS module of claim 15, wherein the control voltage is a first control voltage, wherein each of the control circuits is a first control circuit, wherein each relay of the first two pairs of relays comprises a second control circuit that configures its respective relay to close responsive to a second control voltage and configures its respective relay to open in the absence of the second control voltage.

17. The ATS module of claim 16, wherein at least one second control circuit of the first two pairs of relays comprises an alternating current-to-direct current (AC-to-DC) converter, wherein when the second control voltage of the at least one second control circuit is an AC control voltage the AC-to-DC converter converts the AC control voltage into a DC control voltage to configure its respective relay.

18. The ATS module of claim 15, wherein the container is sized to fit within one slot of the electronic rack.

* * * * *